(12) United States Patent
Nakajima et al.

(10) Patent No.: US 6,320,409 B1
(45) Date of Patent: Nov. 20, 2001

(54) CMOS MAJORITY CIRCUIT

(75) Inventors: Koji Nakajima; Shigeo Sato, both of Sendai (JP)

(73) Assignee: President of Tohoku University, Sendai (JP)

(*) Notice: Subject to any disclaimer, the term of this patent is extended or adjusted under 35 U.S.C. 154(b) by 0 days.

(21) Appl. No.: 09/637,241

(22) Filed: Aug. 14, 2000

(30) Foreign Application Priority Data

Feb. 16, 2000 (JP) .................................................. 12-038280

(51) Int. Cl.$^7$ ..................................................... H03K 19/23
(52) U.S. Cl. ................................. 326/36; 326/35; 326/87
(58) Field of Search .................. 326/35, 36, 85, 326/87, 91

(56) References Cited

U.S. PATENT DOCUMENTS

| | | | |
|---|---|---|---|
| 5,412,256 | * 5/1995 | Alspector et al. | 395/24 |
| 5,504,780 | * 4/1996 | Alspector et al. | 375/230 |
| 6,169,436 | * 1/2001 | Marbot | 327/270 |

OTHER PUBLICATIONS

Yasuhiro Katayama, et al., "Design of a New CMOS Majority Gate Which Has Very Large Fan–In Capability," Proceedings of the 1999 Electronics Society Conference of IEICE, Sep. 7–10, 1999, p. 98.

Kousuke Suzuki, et al., "High Speed CMOS Majority Gates and Its Application,"IEICE Technical Report, vol. 99, No. 412, Nov. 5, 1999, pp. 25–30.

\* cited by examiner

Primary Examiner—Michael Tokar
Assistant Examiner—Anh Q. Tran
(74) Attorney, Agent, or Firm—Oblon, Spivak, McClelland, Maier & Neustadt, P.C.

(57) ABSTRACT

A majority circuit comprises CMOS circuits is adapted to prevent operation errors due to disagreement of conductance among the transistors of the circuits. Such a majority circuit can realize a large fan in. More specifically, the majority circuit comprises a plurality of CMOS circuits connected in series and having respective gates operating as input sections for receiving a plurality of binary signals, a binary signal detecting section having a current control transistor of the first gate conduction type connected in series to the transistor of the first conduction type and a current control transistor of the second gate conduction type connected in series to the transistor of the second conduction type in each of the CMOS circuits, an output inverter circuit for producing a binary output as output of majority decision for the binary input signals according to the change in the potential of the node of the binary signal detecting section and a bias circuit for controlling the gates of the current control MOS transistors.

8 Claims, 2 Drawing Sheets

CMOS MAJORITY CIRCUIT

CROSS-REFERENCE TO RELATED APPLICATIONS

This application is based upon and claims the benefit of priority from the prior Japanese Patent Application No. 2000-038280, filed Feb. 16, 2000, the entire contents of which are incorporated herein by reference.

BACKGROUND OF THE INVENTION

This invention relates to a majority circuit to suitably be used for a coding system, a neuro chip, a logic circuit or a fault tolerant system and, more particularly, it relates to a majority circuit comprising CMOS inverters.

A majority logic is a basic logic typically required for the coding technology and also in an artificial neural network. It is a logic adapted to output "1" when the number of inputs of "1s" is greater than that of inputs of "0s" and output "0" when the opposite is true, provided that it receives a binary value of "1" or "0" as input at a time. It may be so arranged with a majority circuit that "1" corresponds to logical "true" and "0" corresponds to logical "false" or "1" corresponds to $V_{DD}$ (supply voltage) [V] and "0" corresponds to 0 (ground voltage) [V].

Conventional majority circuits comprising a digital circuit are formed typically by combining a plurality of exclusive ORs (not shown). However, since it is difficult to realize a multi-input gate in a digital circuit, a multi-input majority circuit is inevitably be a multi-stage circuit that is accompanied by the problem of an increased number of stages and delay.

A majority circuit using a CMOS inverter as shown in FIG. 4 has been proposed as means for solving this problem (Charng Long Lee et al. "A novel design of binary majority gate and its application to median filtering" 1990 IEEE International Symposium on Circuits and Systems, 570-3, vol. 1, 4, xxxix+3289 1990, pp. 570–573).

This circuit comprises a voltage divider (initial stage) and an output buffer (final stage). A plurality of (N in FIG. 4) CMOS inverters, each comprising a PMOS transistor 21 and an nMOS transistor 22 is connected in series between the supply voltage $V_{dd}$ and the ground. Their gates 23, 24 are connected with each other to form an input terminal. And the outputs of the CMOS inverters are connected with each other to produce the node M. The node M is connected to the input 29 of an output CMOS inverter 28 also comprising a PMOS transistor 25 and an nMOS transistor 26. Thus, the result of the majority decision is produced from the output ($V_{out}$) 30 of the output CMOS inverter 28.

With the circuit illustrated having inputs ($x_1, x_2, \ldots, x_N$) as shown in FIG. 4, a potential obtained by a division of the voltage using the ratio of the ON-state resistance of the nMOS transistors of the CMOS inverters receiving "1s" at the respective inputs and the ON-state resistance of the pMOS transistors of the CMOS inverters receiving "0s" at the respective inputs appears at the node M.

If the ON-state resistance of each pMOS transistor and that of each nMOS transistors are equal to each other, the potential of the node M is supposed to fall by $V_{dd}/n$ when an input "1" is added. However, in reality, there exists a "zone" where the potential of the node M "varies remarkably" due to the non-linear characteristic of the pMOS transistor and the nMOS transistor.

Meanwhile, the inversion threshold value $V_{th}$ of the output CMOS inverter 28 is so selected as to be between the potential when the number of inputs of "1s" is "greater by one" than that of inputs of "0s" (where the potential of the node M is expressed by $V_{M1}$) and the potential when the number of inputs of "1s" is "smaller by one" than that of inputs of "0s" (where the potential of the node M is expressed by $V_{M2}$). Then, for the majority circuit to operate properly, the requirement (1) of $V_{M1} < V_{th} < V_{M2}$ and the requirement (2) that the zone where the potential of the node M "varies remarkably" is found between $V_{M1}$ an $V_{M2}$ should be met.

The characteristic properties of the nMOS transistors and those of the pMOS transistors of the initial stage for dividing the voltage should be adjusted to meet the requirement (1), whereas the MOS transistors of the initial stage for dividing the voltage and those of the final stage have to be adjusted in a coordinated manner to meet the requirement (2). However, since the characteristics of MOS transistors vary from circuit to circuit as a function of the manufacturing conditions and other factors, it is practically impossible to control them in the design stage. Therefore, the CMOS majority circuit is accompanied by a problem that the arithmetic processing operation cannot satisfy the required level of precision when the number of inputs is increased to consequently reduce the safety margin of operation.

As pointed out above, a majority logic is a basic logic typically required for the coding technology and also in an artificial neural circuit. A majority logic circuit can be formed by combining a plurality of exclusive OR elements and utilizing the technique of digital circuit as described above in terms of conventional technology or by using a plurality of CMOS inverters connected in parallel and an output buffer as described above as a recent development.

However, a majority logic circuit formed by using exclusive OR elements is accompanied by the difficulty with which a multi-input gate is realized that by turn gives rise to the problem of an increased number of stages and delay. On the other hand, a majority circuit formed by combining CMOS inverters is accompanied by an increased number of inputs that reduces the safety margin of operation and the difficulty of controlling the characteristics of the nMOS transistors and the pMOS transistors of the CMOS inverters that vary remarkably to degrade accuracy.

In view of the above circumstances of the prior art, it is therefore the object of the present invention to provide a majority circuit comprising CMOS inverter circuits that include analog circuits and are adapted to automatically adjust the variances in the MOS characteristics that inevitably arise in the manufacturing process. Such a majority circuit can have a large fan in that operates at high speed and is highly integrated in a small area. A majority circuit according to the invention can suitably be used for a communication LSI, a neuro chip or a fault tolerant system.

BRIEF SUMMARY OF THE INVENTION

According to the invention, it is possible to realize a majority circuit comprising CMOS inverters having an electric current control feature by using analog CMOS circuits. Such a majority circuit can have a large fan in that operates at high speed and is highly integrated in a small area. More specifically, according to the invention, a well balanced conductance can be realized between the PMOS transistors and the nMOS transistors of the input section to provide a large safety margin of operation by adding current control MOS transistors to the CMOS inverter.

According to the invention, the above object is achieved by providing a majority circuit comprising:

a plurality of first CMOS circuit connected in parallel and having respective gates operating as input sections for receiving so many binary input signals, the first gate conduction type transistor and the second conduction type transistor of each of the first CMOS circuits being connected to respective current control MOS transistors of the same conduction types;

a binary signal detecting section for detecting the potential of the node connected to the output sections of the first CMOS circuits, the potential of the node varying as a function of the number of "1s" and that of "0s" of the binary input signals;

an output inverter circuit for producing a binary an output as output of majority decision for the plurality of binary input signals according to the change in the potential of the node of the binary signal detecting section; and a bias circuit for controlling the gates of the current control transistors.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
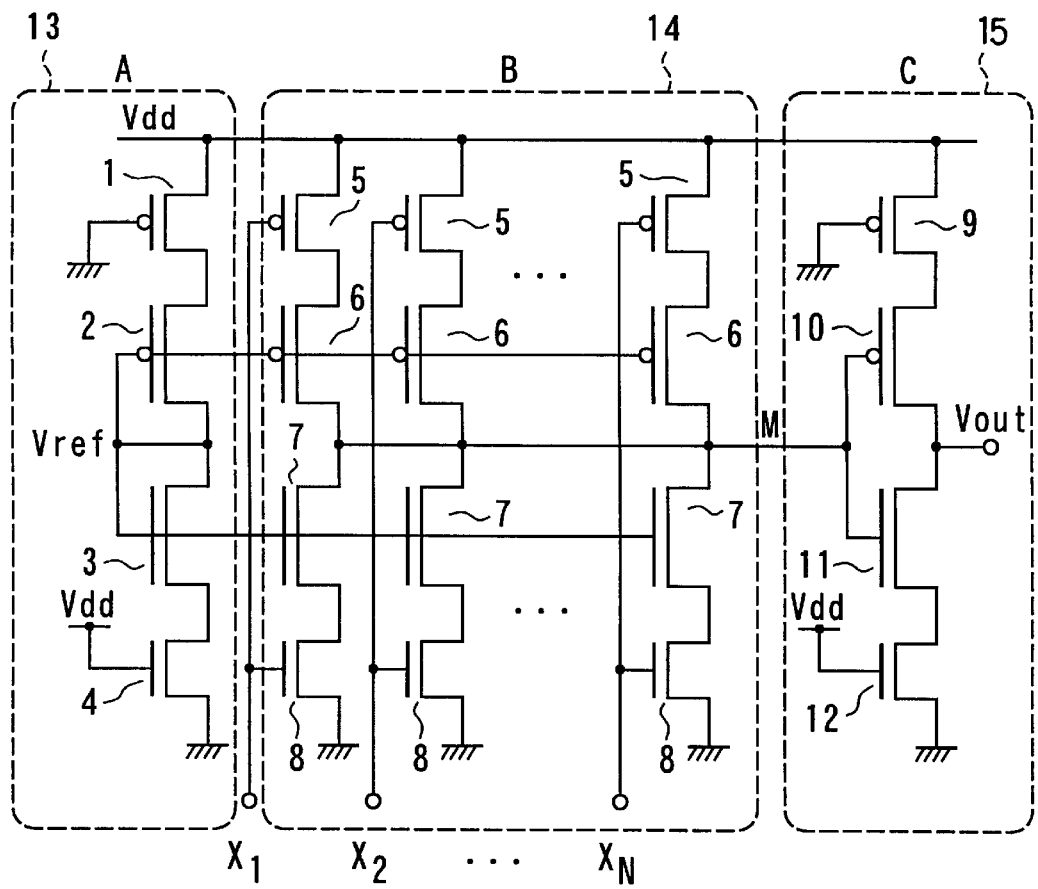
FIG. 1 is a schematic circuit diagram of an embodiment of majority circuit according to the invention.

A majority processing provides the principle of operation of fault-tolerant systems and artificial neural networks. The performance of an information processing apparatus can be improved by using a majority circuit for various information processing operations such as error corrections and median filtering operations. Provided that three binary inputs of a, b and c are given, the logical operation for majority decision is U=ab+bc+ca. While this operation is simple, a large majority circuit is required with any conventional digital techniques when a large number of inputs are involved because the logical processing circuit for dealing with such a large number of inputs is inevitably large.

The present invention provides a CMOS majority circuit that is adapted to operate in a simple but highly stable fashion with an enhanced level of precision in a binary voltage mode. A CMOS circuit comprises a pMOS transistor and an nMOS transistor that are connected in series and whose gates of which are connected to each other to produce the input section of the circuit, while the output section of the circuit is arranged between the pMOS transistor and the nMOS transistor.

A majority circuit according to the invention comprises a plurality of CMOS inverter circuits that are connected in parallel and adapted to receive binary signals as respective inputs and the p and nMOS transistors of each of the CMOS inverter circuits are connected with corresponding current control MOS transistors in series, the gates of the MOS transistors are biased to show a potential equal to the inversion potential of the CMOS output buffer circuit. Then, the outputs of the CMOS inverter circuits are coupled to form a node, or node M, which is connected to the gate of the CMOS output buffer circuit to provide the majority decision at the output of the output buffer circuit.

A majority circuit according to the invention can be realized by using CMOS circuit elements that can be prepared by means of an ordinary manufacturing process and the number of logic stages does not have to be increased if the number of input is raised. Thus, the delay time of the majority circuit where arithmetic processing operations are performed in parallel is always constant. Additionally, since the discrepancies between the parameters of the pMOS transistors and those of the nMOS transistors used in the circuit are automatically adjusted, the offset of the potential of the node M that arises due to the disagreement of the conductance of the nMOS transistors and that of the pMOS transistors is cancelled. Additionally, a large safety margin of operation can be provided because the MOS transistor are operated in the saturation region.

Now, the present invention will be described in detail by referring to the accompanying drawing that illustrates a preferred embodiments of the invention. Throughout several views of the drawing, same elements are denoted respectively by the same reference symbols.

FIG. 1 is a schematic circuit diagram of an embodiment of majority circuit according to the invention. MOS transistors may be used for all the circuit elements.

Referring to FIG. 1, section A 13 is a bias circuit for generating a voltage same as the inversion threshold voltage of the CMOS inverter of section C 15. The first and second pMOS transistors 1, 2 and the first and second nMOS transistors 3, 4 are connected in series. The source of the first pMOS transistor 1 and the gate of the second nMOS transistor 4 are connected to $V_{dd}$, while the gate of the first pMOS transistor 1 and the source of the second nMOS transistor 4 are grounded. The gate and the drain of the second PMOS transistor 2 and those of the first nMOS transistor 3 are connected to $V_{ref}$.

Each of the transistors of the section A 13 is made to show a profile and an impurity density distribution same as the corresponding transistor of the section C 15 so that the voltage generated at $V_{ref}$ becomes equal to the inversion threshold voltage of the inverter of the section C.

Section B 14 has CMOS input sections for receiving N signals (each signal being equal to "1" or "0"). The potential $V_M$ at node M changes as a function of the N signals applied to the section B 14. The CMOS input sections form a parallel circuit. In each of the CMOS input sections, the third and fourth pMOS transistors 5, 6 and the third and fourth nMOS transistors 7, 8 of each of the CMOS input sections are connected in series and the source of the third pMOS transistor 5 that is a switching transistor is connected to $V_{dd}$ while the source of the fourth nMOS transistor 8 that is also a switching transistor is grounded. Input signals ($x_1$, $x_2$, ..., $x_N$) are applied to the respective gates of the third pMOS transistors 5 and also to those of the fourth nMOS transistors 8. Each of the input signals ($x_1, x_2, \ldots, x_N$) takes a binary value. The gate of the fourth pMOS transistor 6 that is a current control transistor and that of the third nMOS transistor 7 that is also a current control transistor are connected to $V_{ref}$. The drain of the fourth PMOS transistor 6 and that of the third nMOS transistor 7 are connected to node M.

If a total of m "1s" are input to the section B14, the potential ($V_M$) of the node M when m=N/2 (N being the total number of the input signals) is equal to the voltage generated in section A as it is combined with that of the section A.

The fourth pMOS transistor 6 that is a current control transistor and the third nMOS transistor 7 that is also a current control transistor operate as so many active loads that sharpen the change at and near N/2 relative to the change in the number of inputs of "1s" (or "0s"). In other words, they make $|V_M-V_{ref}|$ show a large value when the number of "1s" is close to that of "0s".

The section C 15 is an inverter circuit for generating a majority output as a function of the potential $V_M$. The fifth and sixth pMOS transistors 9, 10 and the fifth and sixth nMOS transistors 11, 12 are connected in series. The source of the fifth pMOS transistor 9 and the gate of the sixth nMOS transistor 12 are connected to $V_{dd}$, while the gate of the fifth pMOS transistor 9 and the source of the sixth nMOS transistor 12 are grounded. The gate of the sixth pMOS transistor 10 and that of the fifth nMOS transistor 11 are connected to the node M. The drain of the sixth pMOS transistor 10 and that of the fifth nMOS transistor 11 are connected to output $V_{out}$ to produce the outcome of the majority decision in the form of a binary signal.

The input signals are expressed by $x_1, x_2, \ldots, x_N$ and each of the input signals takes a value of "1"=$V_{dd}$ or "0"=ground (0). The inverter of the section C 15 outputs "1" if the number of "1s" is greater than that of "0s", whereas it outputs "0" if the number of "0s" is greater than "1s". In other words, if the total number of input signals is N and m represents the number of "1s", the $V_{out}$ is equal to "1" only when m>N/2 (N being an odd number).

In the embodiment of FIG. 1, each of the pMOS transistors (1, 2;, 5, 6; 9, 10) and the corresponding one of the nMOS transistors (4, 3; 8, 7; 12, 11) are arranged symmetrically relative to the node M so that the current control MOS transistors (adjacent to the node M) and the switching MOS transistors (adjacent to $V_{dd}$ or ground) are connected to form columns. The voltage $V_{ref}$ is equal to the inversion threshold voltage of the buffer (inverter of the section C) and the potential of M ($V_M$) agrees with $V_{ref}$ when the number of inputs of "1s"=N/2. Then, in the section B14, the electric current flowing through each of the pMOS transistors receiving "1" as input is equal to the electric current flowing through each of the nMOS transistors receiving "0" as input to maximize the resolution of the circuit.

Assuming that the total number of inputs is N and the number of inputs of "1s" is m and also assuming that the nMOS and pMOS transistors have same characteristics with opposite polarities and N=2n-1, the safety operation margin of the circuit can be determined in a manner as described below.

Figure 2:
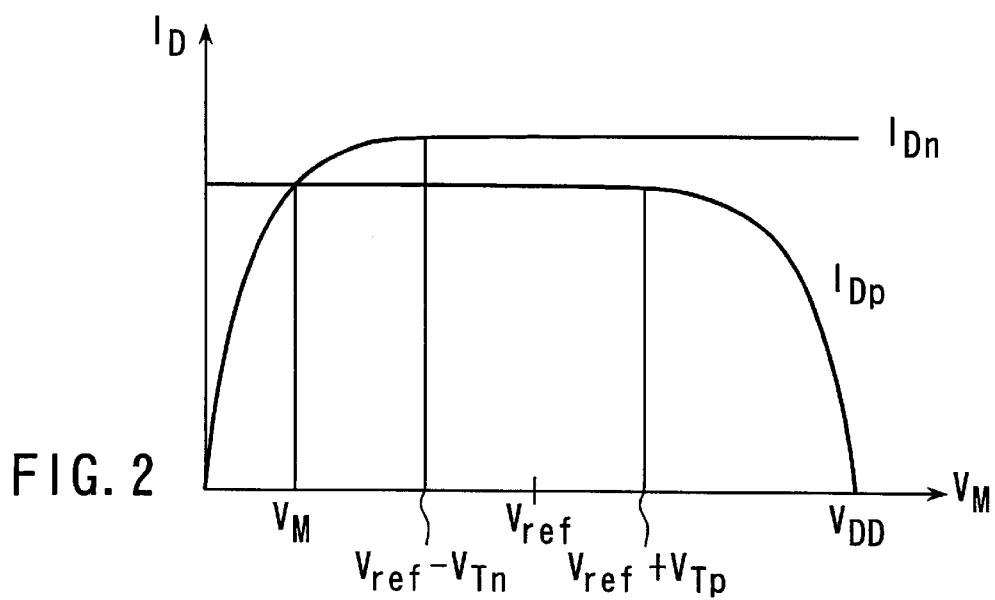
FIG. 2 is a graph showing the $V_M$–$I_D$ characteristic of the majority circuit comprising inverters according to the invention.

If the total number of inputs N is relatively small, the output $V_M$ of the CMOS inverters can be assumed to reflect ideal MOS characteristics. The $V_M$-$I_D$ characteristic of the current control MOS transistors when m·n is shown in FIG. 2, where $I_{Dp}$ and $I_{Dn}$ respectively represent the sums of the electric currents flowing through the pMOS transistors and the nMOS transistors and $V_{Tp}$ and $V_{Tn}$ respectively represent the threshold voltages of the current control pMOS transistors and the current control nMOS transistors. Then, the resistance of each of the switching n and pMOS transistors can be assumed to be equal 0 when it is on and equal to infinity when it is off relative to the current control n and pMOS transistors.

As clearly seen from FIG. 2, the pMOS transistors operate in the constant current region, whereas the nMOS transistors operate in the resistive region. Then, the following equations hold true.

$$I_{Dp}=(N-m)K_p(V_{DD}-V_{ref}-V_{Tp})^2 \qquad (1)$$

$$I_{Dn}=mK_n\{2(V_{ref}-V_{Tn})V_M-V_M^2\} \qquad (2)$$

$$I_{Dp}=I_{Dn} \qquad (3)$$

$V_M$ can be determined from equations (1), (2) and (3) above.

$$V_M = V_{ref} - V_{Tn} - \sqrt{(V_{ref}-V_{Tn})^2 - \frac{(N-m)K_p}{mK_n}(V_{DD}-V_{ref}-V_{Tp})^2} \qquad (4)$$

For simplification, assume that $K_p=K_n$, $V_{Tn}=V_{Tp}=V_T$ and $V_{ref}=V_{DD}/2$, then the equation below is obtained.

$$V_M = (V_{ref} - VT)\left(1 - \sqrt{\frac{1}{m}}\right) \qquad (5)$$

If the number of inputs of "1s" differs by one from that of inputs of "0s" and hence m=n, the equation below is obtained.

$$V_M = (V_{ref} - V_T)\left(1 - \sqrt{\frac{2}{N+1}}\right) \qquad (6)$$

On the other hand, if the total number of inputs N is relatively large, $V_M-V_{ref}$ can be approximated by the formula below by taking channel length modulation effect and body effect into consideration.

$$V_M - V_{ref} \cong \frac{N-2n}{n \cdot \Delta n - (N-n) \cdot \Delta p} \qquad (7)$$

Note that $I_0 \Delta n$ and $I_0 \Delta p$ ($I_0$ being a constant) correspond respectively to the changes in the electric currents flowing through the nMOS transistors and pMOS transistor relative to the node voltage $V_M$.

$\Delta n$ is expressed by the formula below:

$$\Delta_n \cong \lambda_n - \frac{2\left(1+\frac{d\delta_n}{dV_n}\right)}{V_{ref}-V_n-V_{Tn}-\delta_n}\frac{\partial V_n}{\partial V_M}, \qquad (8)$$

where $\lambda_n$ and $\delta_n$ are respectively the channel modulation coefficient and the amount of increase of the threshold value of the current control nMOS transistors due to body effect and $V_n$ is the potential of the node between the current control nMOS transistor and the switching nMOS of each of the CMOS input sections. Note that body effect operates to raise the safety margin of operation.

If Δn=−Δp (=Δ) is assumed, the safety margin can be approximated by the formula below:

$$|V_M - V_{ref}| \cong \frac{1}{N \cdot \Delta}, \quad (9)$$

where Δ represents a value that is determined as a function of channel length modulation effect and body effect of the MOS transistors, which is about between $10^{-3}$ and $10^{-2}[V^{-1}]$ under specific fabrication conditions, assuming $V_{DD}$=5[V], $V_{ref}$=$V_{DD}$/2, $V_{Tn}$=0.9[V] and $\lambda_n$=0.06 $[V^{-1}]$. It will be seen therefrom that a sufficiently large safety margin is provided for a large value of N.

When the section B of FIG. 1 is formed by using ordinary CMOS circuits, the conductance of the ordinary nMOS transistors and that of the ordinary pMOS transistors in the circuits do not agree with each other because the conductance varies greatly depending on the combination of the number of "1s" and that of "0s" of the input signals. This is one of the reasons that reduce the safety operation margin of a conventional majority circuit using a CMOS circuit.

The safety operation margin of the majority circuit is determined as a function of the difference between the potential ($V_M$) of the node M and the inversion threshold value ($V_{ref}$) of the inverter 15 when the difference between the number of "1s" and that of "0s" is equal to one. In the case of this embodiment having the above described circuit configuration, the overall conductance of the nMOS transistors and that of the pMOS transistors of each CMOS circuit of the section B 14 that are connect in series are made equal to each other to maximize the safety margin of operation. It has been found by the inventor of the present invention that the number of inputs can be raised to as much as about 1,000 in a CMOS majority circuit according to the invention if the thermal noise of the circuit is taken into consideration.

It has also been found that the processing speed can be made faster than 10 ns. While binary digital signals are used as input and output signals of the CMOS majority circuit, a fast processing speed and a large fan in can be realized with the circuit because it operates in a rather analog fashion.

As for the power dissipation, the power dissipation under the worst possible circumstances is not related to the operating frequency because a through current constantly flows through the majority circuit of the present invention. As a result, the ratio of the power dissipation to the processing speed decreases with increasing frequency.

Figure 3:
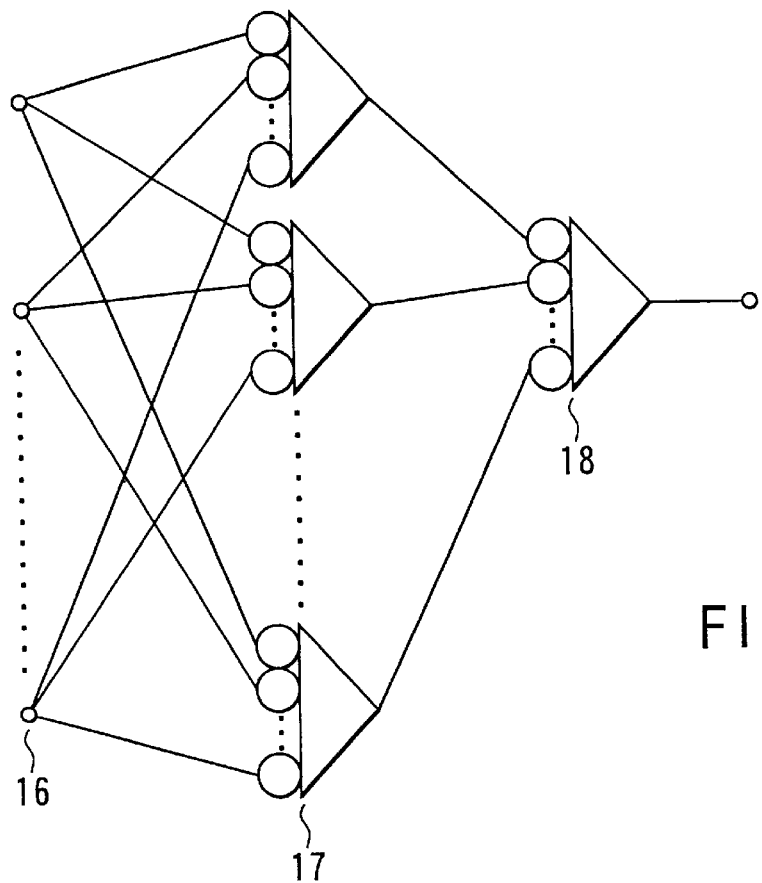
FIG. 3 is a schematic circuit diagram of a majority logic circuit according to the invention.
Figure 4:
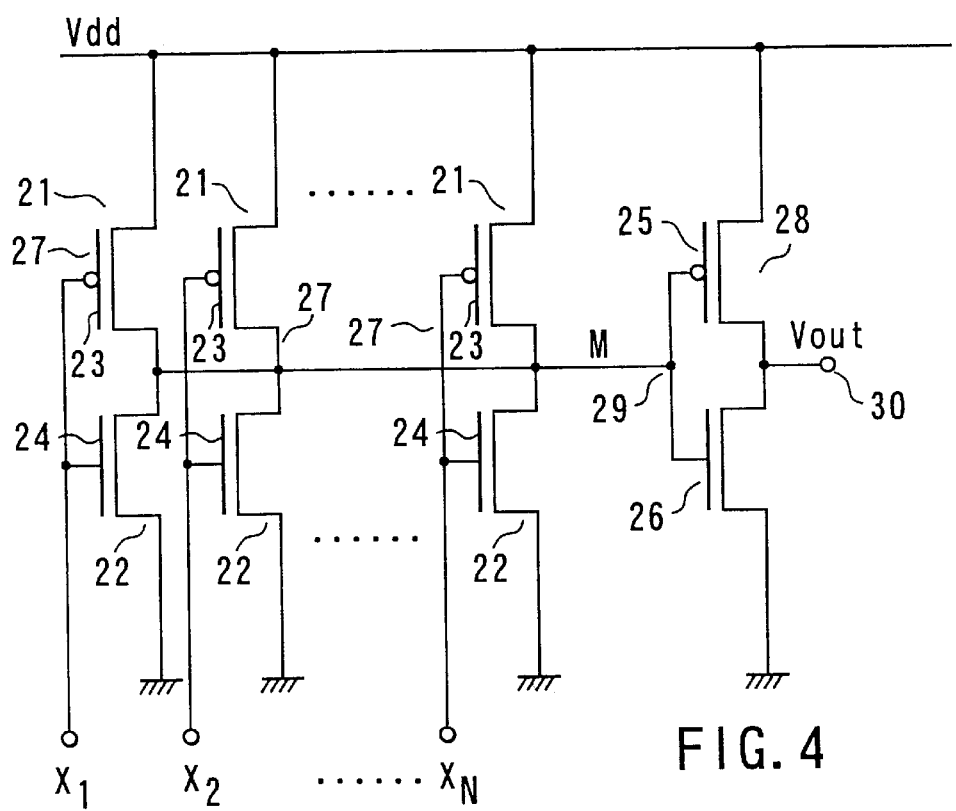
FIG. 4 is a schematic circuit diagram of a known majority circuit.

FIG. 3 is a schematic circuit diagram of a majority logic circuit comprising majority circuits according to the invention. It has a three-layer circuit configuration including an input layer 16, an intermediate layer 17 using majority circuits and an output layer 18 also using majority circuits. The number of inputs of each of the majority circuits is N (an odd number). The input signals are led to the majority circuits of the intermediate layer 16 by way of the input layer 16 and the outputs of the majority circuits of the intermediate layer 16 are fed to the majority circuits of the output layer 18. The output of the output layer 18 is the majority decision result. This majority logic circuit can be made to carry out various arithmetic processing operations by changing the connection weights of each majority circuit. An N parity operation, that requires log N computational stages with a majority circuit using EXOR gates, can be carried out in three stages regardless of the number of inputs if a majority logic circuit according to the invention is used.

While the present invention is described above in terms of a preferred embodiment thereof, a majority circuit and a majority logic circuit according to the invention can be embodied in various different ways. Additionally, the above embodiment can be modified and/or altered in many different ways without departing from the scope of the present invention.

Thus, according to the invention, it is possible to realize a majority circuit comprising CMOS inverters having an electric current control feature by using analog CMOS circuits. Such a majority circuit can have a large fan in that operates at high speed and is highly integrated in a small area. More specifically, according to the invention, a well balanced conductance can be realized between the pMOS transistors and the nMOS transistors of the input section to provide a large safety margin of operation by adding current control MOS transistors to the CMOS inverters. Theoretically, as much as about 1,000 inputs can be used if a safety margin of about 3% of the supply voltage is required.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A majority circuit comprising:
   a plurality of first CMOS circuit connected in parallel and having respective gates operating as input sections for receiving so many binary input signals, the first gate conduction type transistor and the second conduction type transistor of each of said first CMOS circuits being connected to respective current control MOS transistors of the same conduction types;
   a binary signal detecting section for detecting the potential of the node connected to the output sections of the first CMOS circuits, said potential of the node varying as a function of the number of "1s" and that of "0s" of the binary input signals;
   an output inverter circuit for producing a binary output as the output of majority decision for the plurality of binary input signals according to the change in the potential of the node of the binary signal detecting section; and
   a bias circuit for controlling the gates of the current control transistors.

2. A majority circuit according to claim 1, wherein said output circuit includes a second CMOS circuit, the first gate conduction type transistor and the second conduction type transistor of said second CMOS circuit being connected to respective current control MOS transistors of the same conduction types.

3. A majority circuit according to claim 1, wherein said output circuit includes a third CMOS circuit, the first gate conduction type transistor and the second conduction type transistor of said third CMOS circuit being connected to respective current control MOS transistors of the same conduction types.

4. A majority circuit according to claim 3, wherein the inverter circuit formed by said third CMOS circuit and the transistors of the same conduction types connected respectively in series to the first gate conduction type transistor and the second gate conduction type transistor has an inversion threshold voltage equal to the inversion threshold voltage of said output circuit.

5. A three-layer logic circuit comprising:

an input layer for receiving a plurality of binary input signals;

an intermediate layer including a plurality of majority circuits according to claim 1 and adapted to receive a predetermined number of output signals from said input layer; and an output layer including a plurality of majority circuit according to claim 1 and adapted to receive a predetermined number of output signals from said intermediate layer.

6. A majority circuit comprising:

a bias circuit having first and second MOS transistors of the first gate conduction type and first and second MOS transistors of the second gate conduction type connected in series, the source of the first MOS transistor of the first gate conduction type and the gate of the second MOS transistor of the second gate conduction type being connected to the supply voltage, the gate of the first MOS transistor of the first gate conduction type and the source of the second MOS transistor of the second gate conduction type being grounded, the gate and the drain of the second transistor of the first gate conduction type and the gate and the drain of the first MOS transistor of the second gate conduction type being connected to a predetermined bias voltage;

a binary signal detecting section including a plurality of detection circuits connected in parallel, each having third and fourth MOS transistors of the first gate conduction type and third and fourth MOS transistors of the second gate conduction type connected in series, the source of the third MOS transistor of the first gate conduction type being connected to the supply voltage, the source of the fourth MOS transistor of the second gate conduction type being grounded, the input sections connected respectively to the gate of the third MOS transistor of the first gate conduction type and the gate of the fourth MOS transistor of the second gate conduction type being adapted to receive a plurality of binary input signals, the gate of the fourth MOS transistor of the first gate conduction type and the gate of the third MOS transistor of the second gate conduction type being connected to said bias voltage, the drain of the fourth MOS transistor of the first gate conduction type and the drain of the third MOS transistor of the second conduction type being connected to a node; and an inverter circuit having fifth and sixth MOS transistors of the first gate conduction type and fifth and sixth MOS transistors of the second gate conduction type connected in series, the source of the fifth MOS transistor of the first gate conduction type and the gate of the sixth MOS transistor of the second gate conduction type being connected to the supply voltage, the gate of the fifth MOS transistor of the first gate conduction type and the source of the sixth MOS transistor of the second gate conduction type being grounded, the gate of the sixth MOS transistor of the first gate conduction type and the gate of the fifth MOS transistor of the second gate conduction type being connected to said node, the drain of the sixth MOS transistor of the first gate conduction type and the drain of the fifth MOS transistor of the second gate conduction type being connected to an output section to output a binary signal as the outcome of the majority decision.

7. A majority circuit according to claim 6, wherein said bias voltage is the inversion threshold voltage of said inverter circuit.

8. A three-layer logic circuit comprising:

an input layer for receiving a plurality of binary input signals;

an intermediate layer including a plurality of majority circuits according to claim 6 and adapted to receive a predetermined number of output signals from said input layer; and an output layer including a plurality of majority circuit according to claim 6 and adapted to receive a predetermined number of output signals from said intermediate layer.

* * * * *